United States Patent [19]

Endres et al.

[11] 4,065,723
[45] Dec. 27, 1977

[54] TUNED RADIO FREQUENCY AMPLIFIER WITH BACK TO BACK VARACTOR DIODES CONNECTED THROUGH A COMMON CATHODE LEAD

[75] Inventors: Thomas E. Endres; Donald W. Rodeman, both of Kokomo, Ind.

[73] Assignee: General Motors Corporation, Detroit, Mich.

[21] Appl. No.: 714,485

[22] Filed: Aug. 16, 1976

[51] Int. Cl.² ............................................. H03F 3/04
[52] U.S. Cl. ................................... 330/302; 325/464; 330/278; 334/15
[58] Field of Search .................. 325/464, 465; 330/21, 330/31, 35; 334/15

[56] References Cited
U.S. PATENT DOCUMENTS

| | | | |
|---|---|---|---|
| 3,761,823 | 9/1973 | Harris | 334/15 X |
| 3,962,643 | 6/1976 | Ma | 325/464 |

*Primary Examiner*—Lawrence J. Dahl
*Attorney, Agent, or Firm*—Robert M. Sigler

[57] ABSTRACT

A tuned radio frequency amplifier includes signal amplification means having an input and an output and first and second pairs of varactor diodes, each pair having an inductor connected across the anodes and a common tuning voltage supplied to the common cathode. The inductor of the first varactor diode pair provides an input for a signal from an antenna; and the inductor across the second varactor diode pair provides an output for the amplified signal. Means are provided for connecting the input of the signal amplification means to the common cathode of the first varactor diode pair and the output of the signal amplification means to the common cathode of the second varactor diode pair, whereby the range of tuning voltage required for a specified range of tuned frequencies is smaller than if the input and output of the signal amplification means were connected across the anodes of the varactor diode pairs.

2 Claims, 1 Drawing Figure

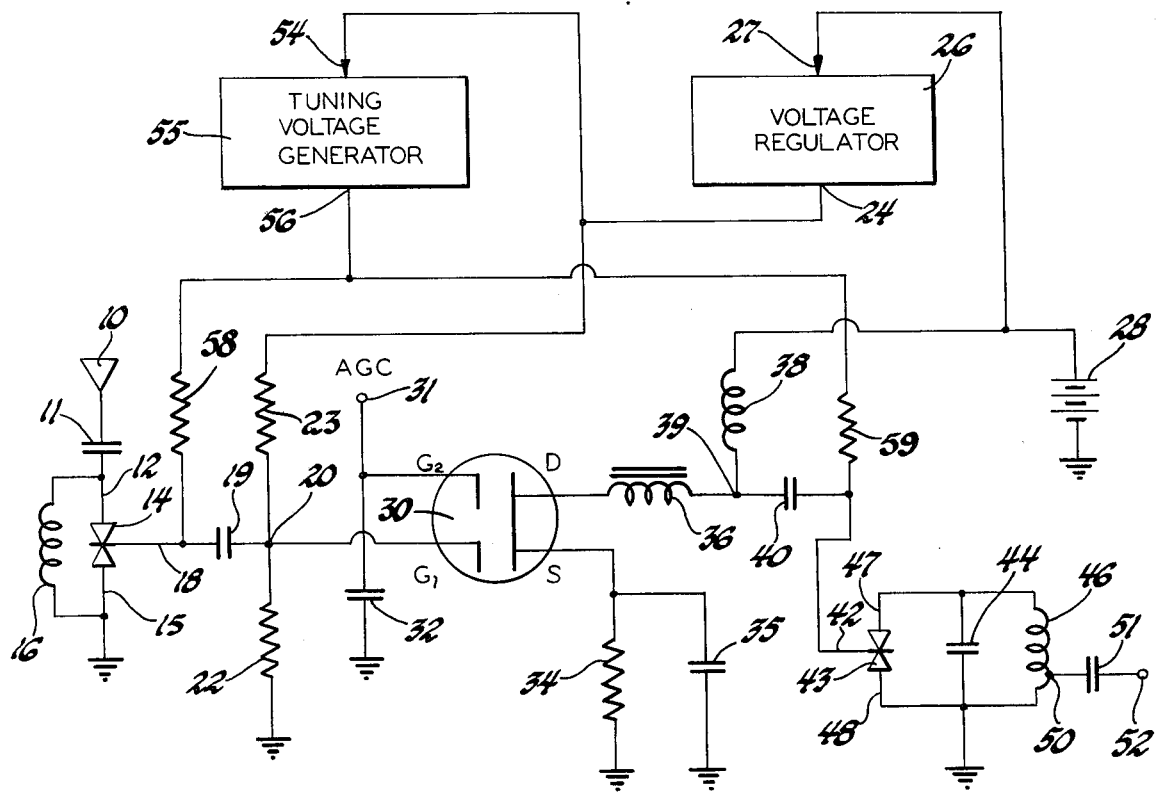

TUNED RADIO FREQUENCY AMPLIFIER WITH BACK TO BACK VARACTOR DIODES CONNECTED THROUGH A COMMON CATHODE LEAD

BACKGROUND OF THE INVENTION

This invention relates to tuned radio frequency amplifiers and specifically for such amplifiers for use in FM radios driven from a low voltage DC power supply, especially such as are designed to be used in motor vehicles. This invention is particularly directed to such tuned radio frequency amplifiers including tank circuits containing back-to-back varactor diodes as the capacitance element thereof.

A tuned tank circuit for a radio frequency amplifier comprises a back-to-back varactor diode pair with its anodes connected across an inductor and its common cathode connected to a source of tuning voltage. Input or output for the circuit is generally made across the anodes; and variation of the tuning voltage causes a change in the capacitance of the back-to-back varactor diode pair with consequent change in frequency of the tank circuit. Since it is generally desired to tune a specified range of frequencies, such as the FM radio band of 88 to 108 Megahertz, a certain minimum range of regulated tuning voltage is required. In applications such as vehicle mounted radios, the limited voltage range of the standard vehicle electrical generating and storage system creates difficulties in obtaining a full tuning voltage range for the FM band.

For example, a standard vehicle electrical generating system provides a potential of 10 to 16 volts which can be regulated for tuning voltage purposes to a constant voltage having a maximum value of approximately 8 volts. With the standard varactor diode tank circuit connections, the range of tuning voltage must extend from slightly below 8 volts to a voltage below 2 volts. However, operation at less than 2 volts produces a number of difficulties. The varactor diode pairs become more nonlinear, with resultant increases in temperature instability and difficulty of tracking parallel tuned circuits; the varactor diode pairs also become more susceptible to overload from forward bias with resultant distortion. If, however, it is desired to keep the minimum tuning voltage above 2 volts, a more expensive regulated power supply is required to boost the available regulated voltage. Both of these approaches have been attempted in the prior art.

SUMMARY OF THE INVENTION

This invention overcomes the difficulties described above by changing the connection to the back-to-back varactor diode pair in order to decrease the voltage range required for the specified tuning range. One of the input or output connections to the varactor diode tank circuit is made through the common cathode of the varactor diode pair. This removes part of the fixed reactance by putting the inductance of one of the anode leads of the varactor diode pair in series with the inductor connected across the anodes and thus increases the ratio of minimum to maximum varactor reactance as the tuning voltage is changed from its minimum to maximum values so that a smaller range of tuning voltage is required for the same range of tuned frequencies. In the case of vehicle-mounted radios, the decrease in required voltage range is sufficient that a tuning voltage range of 2 to 7½ volts covers the FM frequency spectrum of 88 to 108 Megahertz, which minimizes the problems described above.

Further details and advantages of this invention are described in the accompanying drawing and the following description of the preferred embodiment.

DESCRIPTION OF THE PREFERRED EMBODIMENT

Referring to the FIGURE, an antenna 10 is connected through a coupling capacitor 11 to one anode 12 of a back-to-back varactor diode pair 14, the other anode 15 of which is grounded. An inductor 16 is connected across anodes 12 and 15 to form a tank circuit with back-to-back varactor diode pair 14. Antenna 10 could alternatively be connected through capacitor 11 to a tap on inductor 16. Common cathode 18 of back-to-back varactor diode pair 14 is connected through a coupling capacitor 19 to the center junction 20 of a voltage divider comprising a resistor 22 between junction 20 and ground and a resistor 23 between junction 20 and the output 24 of a voltage regulator 26, the input 27 of which is connected to the ungrounded side of a voltage source 28, such as a vehicle storage battery or generator. Junction 20 is connected to the first gate G1 of a field effect transistor or FET 30 having a second gate G2 with connection to a terminal 31 adapted for supply of an automatic gain control voltage from appropriate circuitry, not shown. The second gate is also connected through a capacitor 32 to ground. The source S of FET 30 is connected through a resistor 34 and capacitor 35 in parallel to ground; and the drain D is connected through an inductor 36 and another inductor 38 to the ungrounded side of power supply 28. Inductor 36 is actually a small inductive bead placed on or near the drain lead of FET 30 to reduce high frequency gain and thus help stabilize the amplifier; while inductor 37 is a radio frequency choke. The junction 39 of inductors 36 and 37 is connected through a coupling capacitor 40 to the common cathode 42 of back-to-back varactor diode pair 43. A capacitor 44 and inductor 46 are connected across anodes 47 and 48 of back-to-back varactor diode pair 43, anode 43 being grounded. A tap 50 is provided on inductor 46 and is connected through a coupling capacitor 51 to a terminal 52, which serves as an output for the circuit to the next stage. Tap 50 is shown as being only a turn or a fraction thereof from the grounded end of inductor 46, since the anticipated following circuitry has a low input impedance. If the input impedance of the following circuitry has been high, coupling capacitor 51 could well have been connected to a higher point on inductor 46 or even to anode 47.

Voltage regulator 26 supplies its regulated voltage from output 24 to the input 54 of a tuning voltage generator 55, the output 56 of which is connected through a resistor 58 to common cathode 18, and in parallel, through a resistor 59 to common cathode 42. Tuning voltage generator 55 converts the constant voltage from voltage regulator 26 to a different constant tuning voltage and is adjustable through a control not shown to vary the constant tuning voltage supplied to varactor diode pairs 14 and 43 and thus change the tune frequencies thereof. Inductors 16 and 46 and capacitor 44 are all adjustable during manufacture of the circuit to align the varactor diode pairs 14 and 43 to track together across the FM frequency spectrum of 88 to 108 Megahertz as the tuning voltage supplied from generator 55 is varied from 2 to 7½ volts.

A varactor diode pair, such as pairs 14 and 43, is commercially available as a single discrete element with two anode leads and a single common cathode lead and is functionally equivalent in a circuit to a pair of discrete varactor diodes having cathode leads connected together in a common connection.

In operation, antenna 10 is tuned by the tank circuit comprising varactor diode pair 14 and inductor 16 to receive the signal at a specified frequency in the FM band, the signal being passed from common cathode 18 to signal amplification means comprising FET 30 and its associated circuit elements. The amplified output of the signal amplification means, obtained through coupling capacitor 40, is supplied to common cathode 42 of varactor diode pair 43, which is part of another tank circuit tuned to the same specified FM frequency. The output of the circuit is obtained from the tap 50 of inductor 46 through capacitor 51. As the tuning voltage from generator 55 is varied, the change in capacitance of varactor diode pairs 14 and 43 changes the tuned frequency of the circuit to select different signals for amplification in the signal amplification means.

Further details of the circuit shown, including identification and value of circuit elements and accompanying circuitry, can be found in the 1976 model year addition to the 1974–75 Radio Service Manual of the Delco Radio Division of the General Motors Corporation, and in particular the section entitled "push button/tape-AM-FM stereo/tape using 10 slide tuner". Of course, the embodiment shown and described is a preferred embodiment; but equivalent embodiments will occur to those skilled in the art upon the reading of this specification. Therefore this invention should be limited only by the following claims.

What is claimed is:

1. A tuned radio frequency amplifier for use with a signal receiving antenna, the tuner comprising, in combination:

signal amplification means having an input adapted for connection to the antenna to receive and amplify the signal therefrom and further having an output;

a pair of varactor diodes, each having a cathode and an anode, the cathodes of the varactor diodes being connected together in a common connection;

means for providng a variable regulated tuning voltage to the common connection of the varactor diode cathodes;

an inductor connected between the anodes of the varactor diode, the inductor comprising an output for the amplifier; and means connecting the output of the signal amplification means to the common connection of the varactor diode cathodes, whereby the varactor diodes and inductor form a tuned circuit for the signal amplification means with an input through the common connection, in which a smaller range of tuning voltage is required for a given range of tuned frequencies than would be required if input were through one of the anodes.

2. A tuned radio frequency amplifier for use with a signal receiving antenna, the tuner comprising, in combination:

a first pair of varactor diodes, each having a cathode and an anode, said cathodes being connected together in a first common connection;

a first inductor connected between the anodes of said first pair, the inductor being adapted for connection to the antenna to receive a signal therefrom;

signal amplification means having an input and an output;

a second pair of varactor diodes, each having a cathode and an anode, said cathodes being connected together in a second common connection;

a second inductor connected between the anodes of the second pair, said second inductor comprising an output for the amplifier;

means for providing a variable regulated tuning voltage to the first and second common connections; and means connecting the input of the signal amplification means to the first common connection and the output of the signal amplification means to the second common connection, whereby the first pair of varactor diodes forms a first tuned circuit with a first inductor for the input of the signal amplification means and the second pair of varactor diodes forms a second tuned circuit with the second inductor for the output of the signal amplification means, a smaller range of tuning voltage being required for a given range of tuned frequencies than would be required if the input and output of the signal amplification means were connected to anodes of the first and second pairs of varactor diodes.

* * * * *